(12) United States Patent
Huang et al.

(10) Patent No.: US 11,855,200 B2
(45) Date of Patent: Dec. 26, 2023

(54) HIGH-VOLTAGE SEMICONDUCTOR DEVICES

(71) Applicant: Leadtrend Technology Corporation, Zhubei (TW)

(72) Inventors: Tsung-Yi Huang, Zhubei (TW); Deng-Sheng Huang, Zhubei (TW)

(73) Assignee: LEADTREND TECHNOLOGY CORPORATION, Zhubei (TW)

( * ) Notice: Subject to any disclaimer, the term of this patent is extended or adjusted under 35 U.S.C. 154(b) by 185 days.

(21) Appl. No.: 17/389,656

(22) Filed: Jul. 30, 2021

(65) Prior Publication Data
US 2022/0231165 A1    Jul. 21, 2022

(30) Foreign Application Priority Data
Jan. 18, 2021  (TW) ................................ 110101789

(51) Int. Cl.
*H01L 29/78*  (2006.01)
*H01L 29/06*  (2006.01)
*H01L 29/08*  (2006.01)

(52) U.S. Cl.
CPC ...... *H01L 29/7816* (2013.01); *H01L 29/0653* (2013.01); *H01L 29/0852* (2013.01)

(58) Field of Classification Search
CPC ......... H01L 29/66893–66924; H01L 29/1058; H01L 29/1066; H01L 29/36–365; H01L 21/0257–02584; H01L 29/7816; H01L 29/0653; H01L 29/0852; H01L 29/0619; H01L 29/1087; H01L 29/1083; H01L 29/47; H01L 29/7838; H01L 29/402–407; H01L 29/04–045; H01L 29/16–1608; H01L 21/762

See application file for complete search history.

(56) References Cited

U.S. PATENT DOCUMENTS

| | | | | |
|---|---|---|---|---|
| 5,612,564 A | * | 3/1997 | Fujishima | ........... H01L 29/7801 257/341 |
| 2001/0015459 A1 | * | 8/2001 | Watanabe | ........... H01L 29/7816 257/E29.066 |
| 2010/0148823 A1 | * | 6/2010 | Shimizu | ............. H01L 29/7817 326/102 |

* cited by examiner

*Primary Examiner* — Shahed Ahmed
(74) *Attorney, Agent, or Firm* — McClure, Qualey & Rodack, LLP

(57) ABSTRACT

High-voltage semiconductor devices are disclosed, each having gate, source and drain electrodes. A deep well layer is formed on a substrate and has a surface, where the substrate and the deep well layer are of first-type and second-type conductivities, respectively. A field isolation layer on the surface isolates a drain active region from a source active region. The source electrode contacts the source active region on the surface to form an ohmic contact. The drain electrode contacts the drain active region on the surface. A first well layer of the first-type conductivity is formed on the surface and between the ohmic contact and the drain active region, and at least a portion of the first well layer is under the field isolation layer. A bottom layer of the first-type conductivity is formed at a bottom of the deep well layer. The gate electrode is on the field isolation layer.

20 Claims, 7 Drawing Sheets

HIGH-VOLTAGE SEMICONDUCTOR DEVICES

CROSS-REFERENCE TO RELATED APPLICATION

This application claims priority to and the benefit of Taiwan Application Series Number 110101789 filed on Jan. 18, 2021, which is incorporated by reference in their entirety.

BACKGROUND

The present disclosure relates generally to high-voltage semiconductor devices that can endure high-voltage stress during operation.

To achieve high-speed computation and compact product size, semiconductor devices become more and more complex and vulnerable. Furthermore, in order to be suitable for specific applications, some semiconductor devices must equip with delicate abilities. For example, some integrated circuit chips are used for high power operation that involves networks with power switches, inductors, and capacitors, so the input or output pins of the integrated circuit need to sustain tremendous voltage or current surges. The semiconductor devices connected to the input or output pins always give challenges to designers who are responsible for the structure of semiconductor devices to fulfill new requirements.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein.

DETAILED DESCRIPTION

Figure 1:
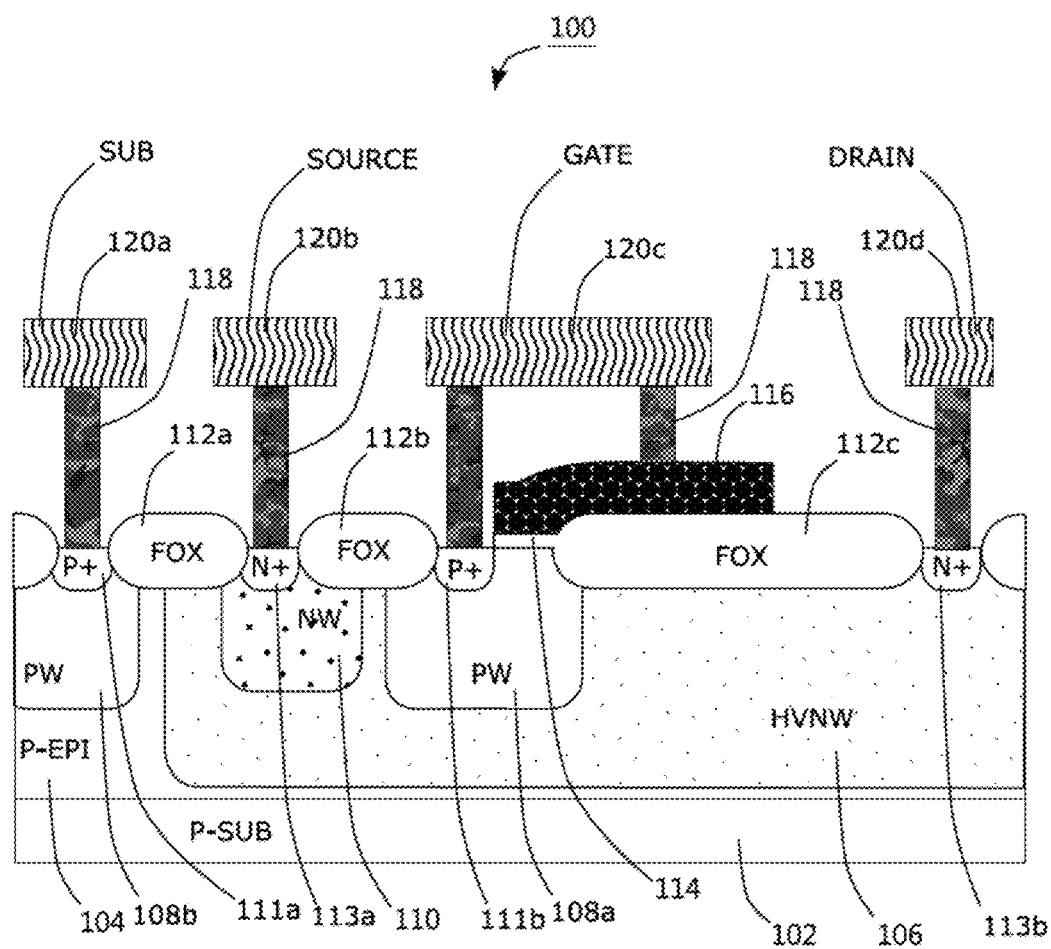
FIG. 1 demonstrates a semiconductor device.

FIG. 1 demonstrates semiconductor device 100, equivalent to a n-type junction field effect transistor (JFET) formed on p-type substrate 102. A p-type material means that the material is conductive and the conductivity of the material is supported by holes with positive charges. A n-type material is also conductive, but its conductivity is supported by electrons with negative charges. Semiconductor device 100 has drain electrode DRAIN, source electrode SOURCE, gate electrode GATE, and substrate electrode SUB. Drain electrode DRAIN can sustain high-voltage input as high as hundreds or tens voltages.

Formed on p-type substrate 102 is p-type epitaxy layer 104, on the surface of which are field isolation layers 112a, 112b and 112c, each for separating different active regions. Gate structures, source doped layers, and drain doped layers of metal-oxide-semiconductor transistors for example can be formed inside an active region. Field isolation layer 112a separates p-type heavily doped layer 111a from n-type heavily doped layer 113a. P-type heavily doped layer 111a physically contacts and electrically connects to p-type well layer 108b, while n-type heavily doped layer 113a to n-type well layer 110. Field isolation layer 112b is between p-type heavily doped layer 111b and n-type heavily doped layer 113a, and field isolation layer 112c between gate oxide layer 114 and n-type heavily doped layer 113b. P-type heavily doped layer 111b physically contacts and electrically connects to p-type well layer 108a, and n-type heavily doped layer 113b to n-type deep well layer 106 thereunder. N-type deep well layer 106 can be formed by lightly doping n-type impurity into a selected area of p-type epitaxy layer 104. The bottom of n-type deep well layer 106 shown FIG. 1 does not touch P-type substrate 102, but it could optionally do in other embodiments.

Stacking on gate oxide layer 114 and field isolation layer 112c is polysilicon layer 116, which electrically connects via contact plugs 118 to metal strip 120c and p-type heavily doped layer 111b. Metal strip 120c and related contact plugs 118 serve as gate electrode GATE of semiconductor device 100 and as a metal interconnection capable of connecting to other electric circuitry on p-type substrate 102. Analogously, metal strip 120b and related contact plugs 118 serve as source electrode SOURCE of semiconductor device 100, and metal strip 120d and related contact plugs 118 as drain electrode DRAIN. Metal strip 120a and contact plug 118 thereunder are substrate electrode SUB electrically connected to substrate 102. According to an embodiment of the invention, substrate electrode SUB connects to a ground voltage of a power supply.

Gate-to-source voltage $V_{GS}$, the voltage difference between gate electrode GATE and source electrode SOURCE, can control the width of the depletion region over the PN junction between p-type well layer 108a and n-type deep well layer 106, and accordingly controls the channel in n-type deep well layer 106 that electrically connects n-type heavily doped layer 113b to n-type well layer 110. Polysilicon layer 116 on both gate oxide layer 114 and field isolation layer 112c can also act as a field plate to fine tune the electric field distribution inside n-type deep well layer 106, to enhance the drain-to-source breakdown voltage of semiconductor device 100.

An inherent issue occurs to semiconductor device 100 in FIG. 1: gate leakage to gate electrode GATE. During operation, once the voltage at source electrode SOURCE happens to suddenly drop way below the voltage at gate electrode GATE, the PN junction between p-type well layer 108a and n-type deep well layer 106 becomes forward biased, causing current surge flowing from gate electrode GATE to source electrode SOURCE. This current surge is called as gate leakage, and is not allowable in some applications.

Figure 2A:
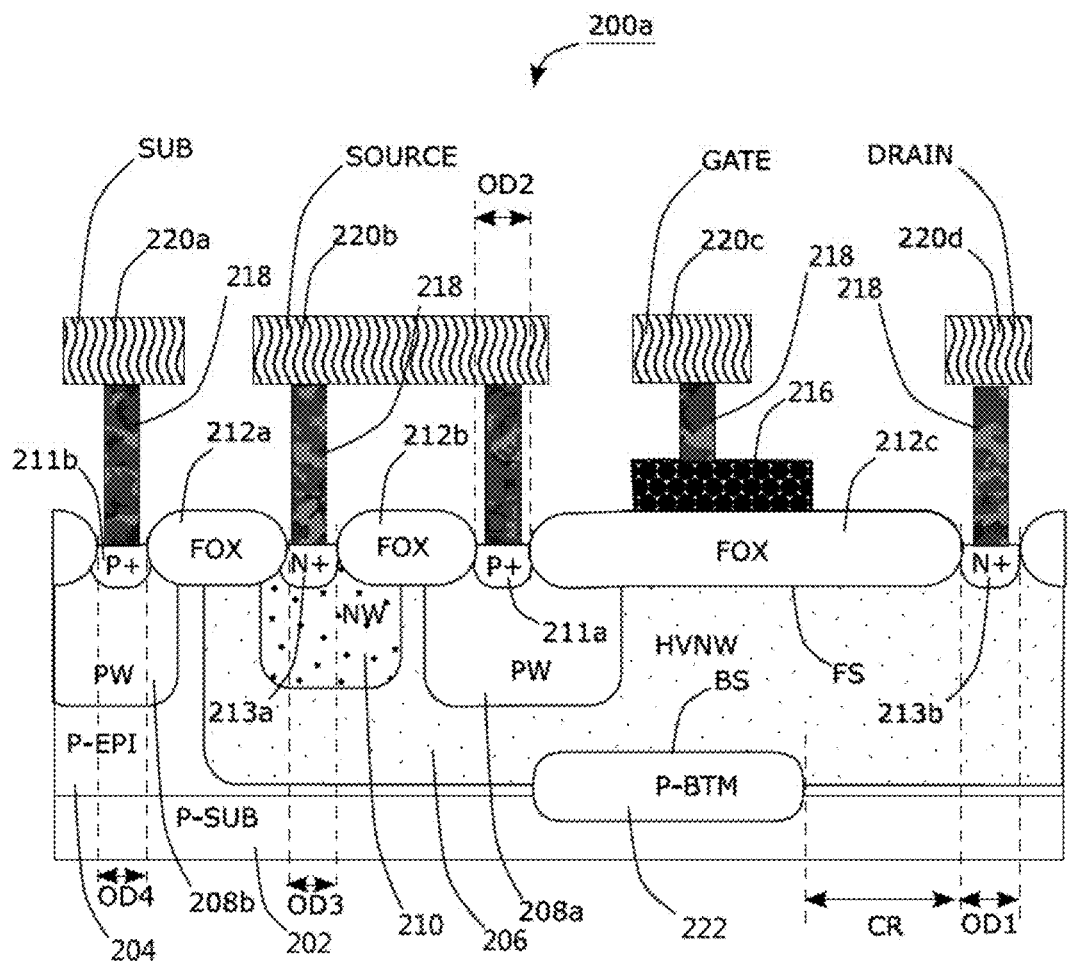
FIG. 2A demonstrates a cross-sectional view of a semiconductor device according to embodiments of the invention.

FIG. 2A demonstrates a cross-sectional view of semiconductor device 200a according to embodiments of the invention, having drain electrode DRAIN, source electrode SOURCE, gate electrode GATE, and substrate electrode SUB. Some structures or connections shown in FIG. 2A are similar or the same with those in FIG. 1, and are not detailed hereinafter because they are comprehensible in view of the teaching to FIG. 1.

N-type deep well layer 206 has surface FS, on which field isolation layers 212a, 212b and 212c are formed. Field isolation layer 212a separates active region OD4 from active region OD3, field isolation layer 212b active region OD3 from active region OD2, and field isolation layer 212c active region OD2 from active region OD1. Each active region shown in FIG. 2A has only one heavily doped layer formed within, but this invention is not limited to however. An active region according to embodiment of the invention can have, among others, several heavily doped layers and/or several gate oxide layers formed within.

P-type heavily doped layer 211b is formed inside active region OD4 and on a surface of p-type well layer 208b, to provide electric connection from p-type well layer 208b, p-type epitaxy layer 204 and p-type substrate 202 to metal strip 220a. Metal strip 220a and contact plug 218 thereunder are substrate electrode SUB, electrically connecting to p-type substrate 202 and to a ground voltage of a power supply according to embodiments of the invention.

Formed within active region OD3 is n-type heavily doped layer 213a, which contacts a contact plug 218 to form an ohmic contact providing electric connection to n-type well layer 210 formed on surface FS of n-type deep well layer 206. Formed within active region OD2 is p-type heavily doped layer 211a, which contacts a contact plug 218 to form an ohmic contact providing electric connection between metal strip 220b and p-type well layer 208a. FIG. 2A shows that a portion of p-type well layer 208a is under field isolation layer 212c. From a top view that can be witnessed by FIG. 2A, a portion of p-type well layer 208a overlaps with field isolation layer 212c, and another portion is located between field isolation layer 212c and n-type heavily doped layer 213a. N-type heavily doped layer 213a electrically shorts to p-type heavily doped layer 211a via contact plugs 218 and metal strip 220b. Metal strip 220b and associated contact plugs 218 are deemed as a source metal interconnection, acting as source electrode SOURCE of semiconductor device 200a. Source metal interconnection equivalently contacts a surface of p-type well layer 208a. Active region OD3 can be deemed as a source active region. According to other embodiments of the invention, field isolation layer 212b in FIG. 2A is omitted, and active regions OD3 and OD2 merge to be a common source active region, within which p-type heavily doped layer 211a and n-type heavily doped layer 213a are formed.

Formed within active region OD1 is n-type heavily doped layer 213b, contacting with a contact plug 218 to form an ohmic contact that electrically shorts metal strip 220d to n-type deep well layer 206. Metal strip 220d and the contact plug 218 thereunder in combination construct a drain metal interconnection that contacts n-type heavily doped layer 213b in active region OD1, and acts as drain electrode DRAIN of semiconductor device 200a. Analogously, active region OD1 can be deemed as a drain active region.

Polysilicon layer 216, acting as a control gate, is formed on field isolation layer 212c, and electrically connects to metal strip 220c via a contact plug 218. Metal strip 220c and the contact plug 218 thereunder in combination are deemed as a gate metal interconnection, acting as gate electrode GATE of semiconductor device 200a. According to embodiments of the invention, gate oxide layer 114 in FIG. 1 does not happen under polysilicon layer 216 in FIG. 2A, so the gate-to-source breakdown voltage of semiconductor device 200a could be higher because field isolation layer 212c can sustain a higher breakdown voltage than gate oxide layer 114 in FIG. 1 does.

At bottom BS of n-type deep well layer 206 is buried p-type bottom layer 222. As shown in FIG. 2A, p-type bottom layer 222 occupies a bottom portion of n-type deep well layer 206, and a top portion of p-type substrate 202. As demonstrated by FIG. 2A, p-type bottom layer 222 overlaps at least partially with field isolation layer 212c, and keeps distance CR away from active region OD1. In other words, p-type bottom layer 222 does not overlap with active region OD1. P-type bottom layer 222 in FIG. 2A also partially overlaps with p-type well layer 208a. For example, a predetermined top area of p-type substrate 202 is doped with p-type impurity before the formation of p-type epitaxy layer 204, and a thermal process after the formation of p-type epitaxy layer 204 can drive and diffuse the p-type impurity to form p-type bottom layer 222.

Figure 2B:
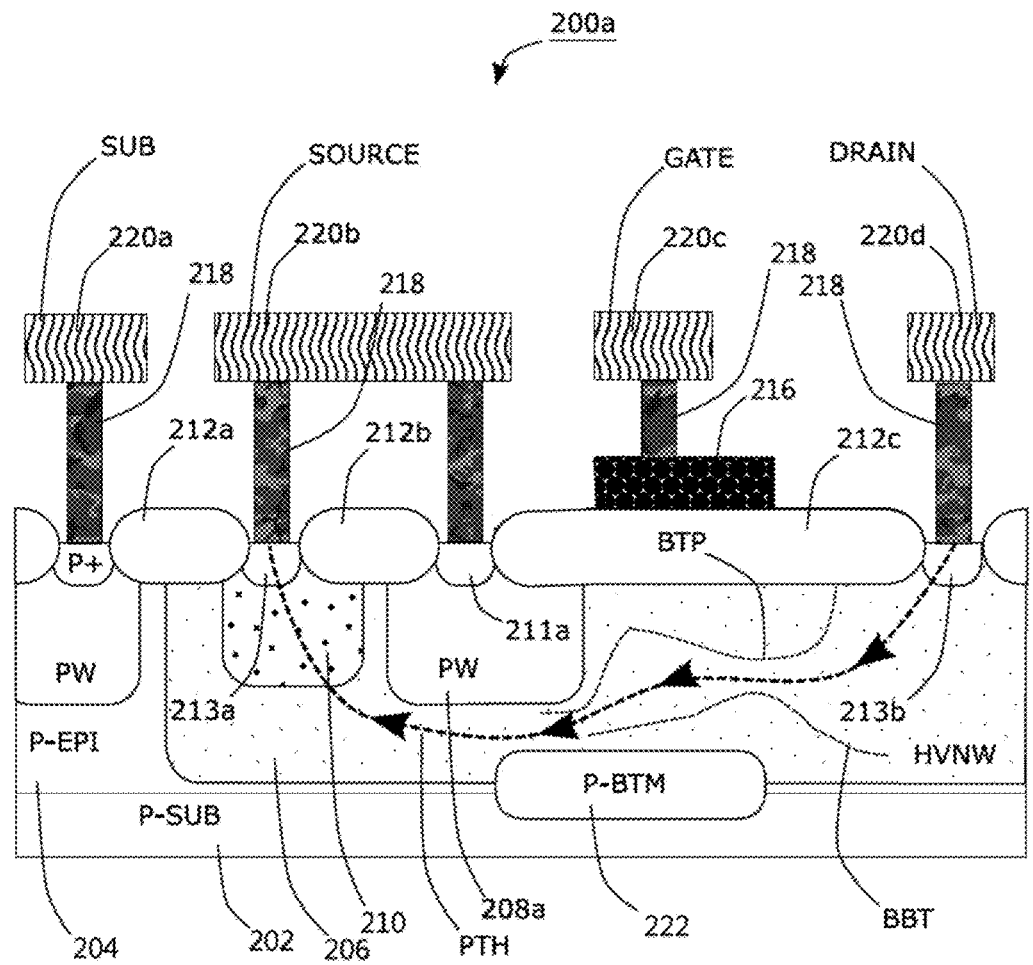
FIG. 2B demonstrates conductive channel PTH in the semiconductor device in FIG. 2A.

FIG. 2B demonstrates conductive channel PTH in semiconductor device 200a, that n-type deep well layer 206 provides to electrically connect drain and source electrodes DRAIN and SOURCE. Conductive channel PTH goes from drain electrode DRAIN, through a gap between p-type well layer 208a and p-type bottom layer 222, through n-type well layer 210, and to source electrode SOURCE. FIG. 2B also demonstrates edges BTP and BBT of depletion regions, that substantially determine the width of conductive channel PTH. When edges BTP and BBT touch each other, it is the condition of channel pinch-off or current cut-off, implying that current flowing through conductive channel PTH becomes about constant even if the drain-to-source voltage of semiconductor device 200a is further increased. The voltage at gate electrode GATE can control the location of edge BTP. For example, when the voltage at gate electrode GATE becomes more negative in respect to that at source electrode SOURCE, the depletion region under the bottom of field isolation layer 212c is wider, making edge BTP closer to edge BBT. P-type well layer 208a could reduce the surface electric field of n-type deep well layer 206, enhancing drain-to-source breakdown voltage of semiconductor device 200a. The location, the size, and the impurity concentration of p-type bottom layer 222 could determine the formation of edge BBT in FIG. 2B, to adjust the pinch-off voltage, the drain-to-source voltage when edges BTP and BBT merge. In other words, p-type bottom layer 222 could also improve drain-to-source breakdown voltage of semiconductor device 200a.

Figure 2C:
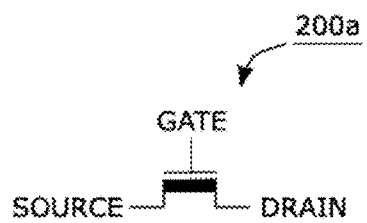
FIG. 2C demonstrates a symbol representing the semiconductor device in FIG. 2A.

FIG. 2C demonstrates a symbol representing semiconductor device 200a, which is a depletion-mode metal-oxide-semiconductor (MOS) transistor. Gate electrode GATE, electrically connecting to polysilicon layer 216 on field isolation layer 212c in FIG. 2A, controls conductive channel PTH within n-type deep well layer 206. When gate-to-source voltage of semiconductor device 200a is 0V, edges BTP and BBT do not merge and conductive channel PTH conducts current, so semiconductor device 200a is a depletion-mode device using thick field isolation layer 212c as its gate oxide.

Semiconductor device 200a in FIG. 2A does not have gate leakage, the inherent issue occurring to semiconductor device 100 in FIG. 1. P-type well layer 208a electrically shorts to n-type well layer 210 via source metal interconnection, which includes metal strip 220b and related contact plugs 218. Therefore, p-type well layer 208a and n-type well layer 210 have a substantially common voltage, which is the present source voltage of semiconductor device 200a. The gate voltage applied to gate electrode GATE can reach polysilicon layer 216 on field isolation layer 212c, but cannot reach p-type well layer 208a. Therefore, in semiconductor device 200a, even if the gate voltage at gate electrode GATE briefly exceeds the source voltage at source electrode SOURCE, there will be no gate leakage from gate electrode GATE to source electrode SOURCE in condition that field isolation layer 212c does not break down.

Figure 3:
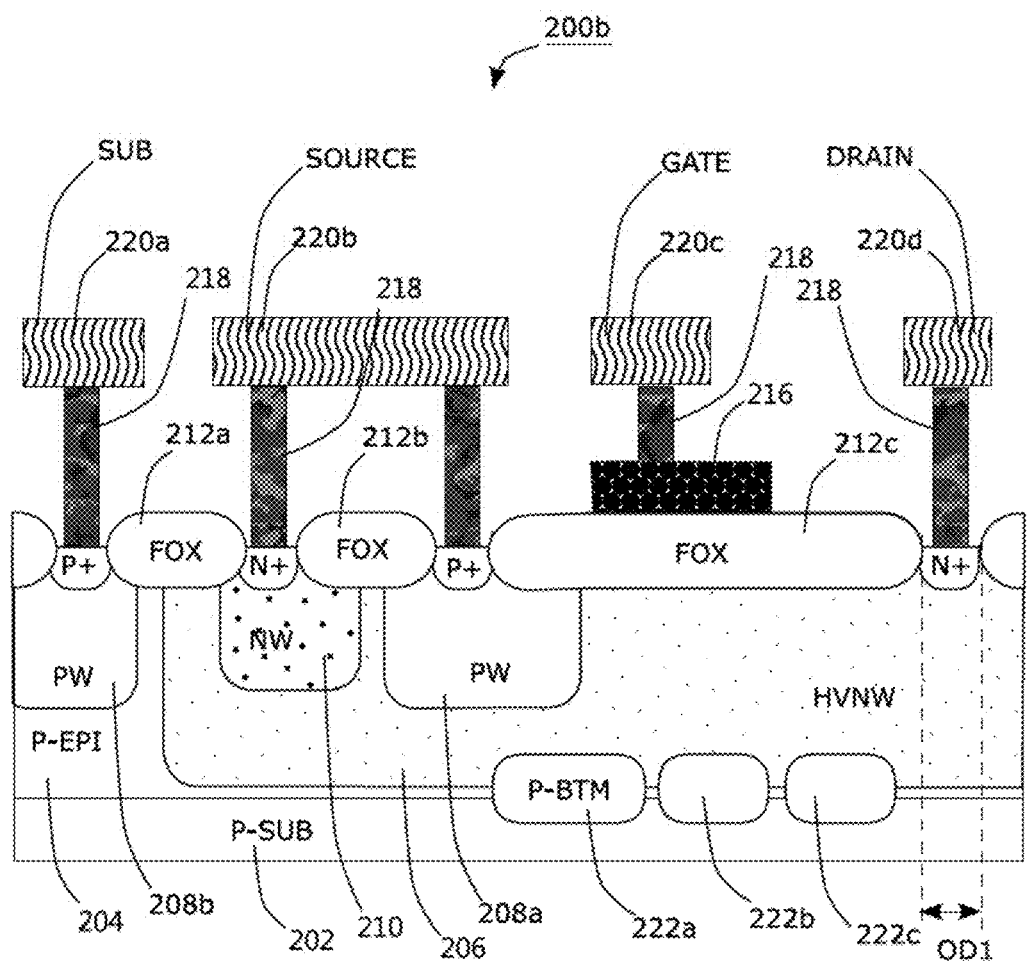
FIGS. 3 and 4 demonstrate cross-sectional views of semiconductor devices according to embodiments of the invention.

FIG. 3 demonstrates a cross-sectional view of semiconductor device 200b according to embodiments of the invention. FIG. 3 has structures or connections similar or the same with those shown by semiconductor devices 100 and 200a in FIGS. 1 and 2A, and these structures or connections are not detailed herein because they are comprehensible in view of the teaching to FIGS. 1 and 2A. Unlike the single p-type bottom layer 222 of semiconductor device 200a in FIG. 2A, semiconductor device 200b in FIG. 3 has several p-type bottom layers 222a, 222b and 222c, each at least partially overlapping with field isolation layer 212c. None of p-type bottom layers 222a, 222b and 222c overlaps with active region OD1 however. Fine tuning the number, the size, the location of the p-type bottom layers could enhance the drain-to-source breakdown voltage of semiconductor device 200b.

Figure 4:
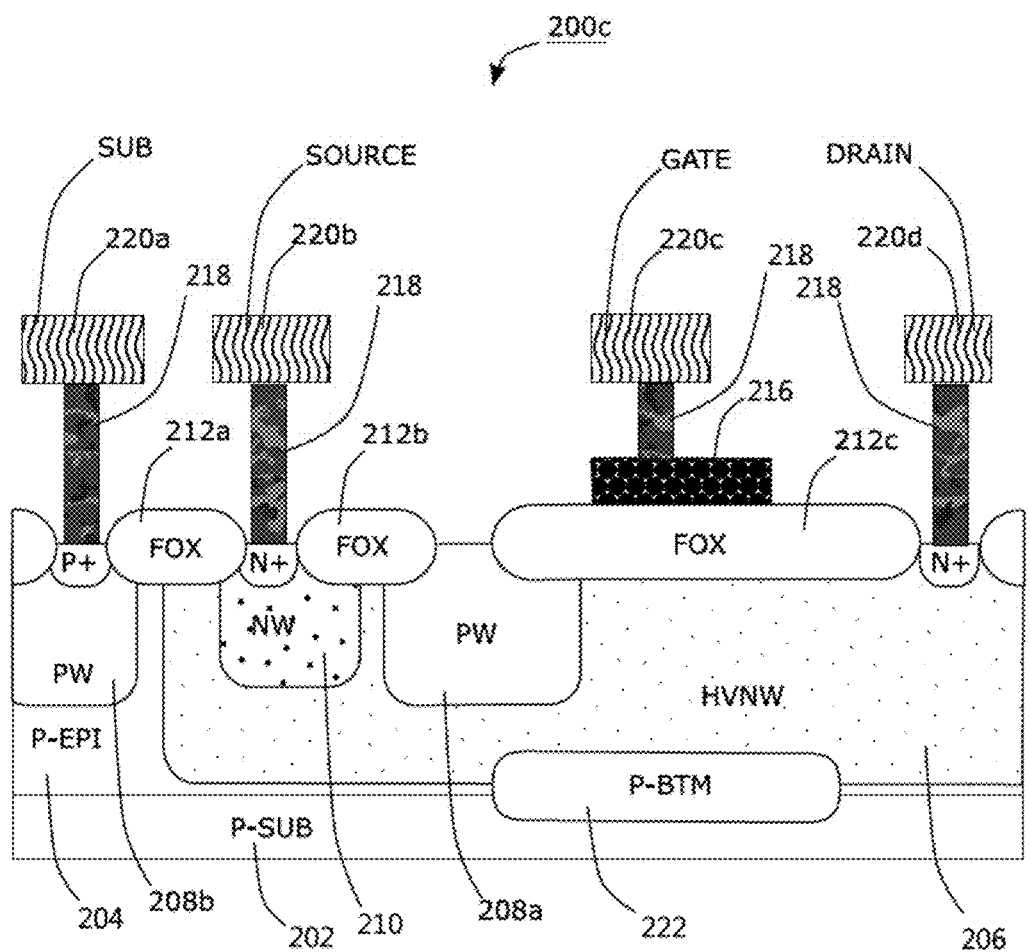

FIG. 4 demonstrates a cross-sectional view of semiconductor device 200c according to embodiments of the invention. FIG. 4 has structures or connections similar or the same with those shown by semiconductor devices 100, 200a and 200b in FIGS. 1, 2A and 3, and these structures or connections are not detailed herein because they are comprehensible in view of the teaching to FIGS. 1, 2A and 3. Unlike p-type well layer 208a of semiconductor device 200a in FIG. 2A that electrically shorts to n-type well layer 210, p-type well layer 208a in FIG. 4 is electrically floating, meaning that p-type well layer 208a does not connect to any metal interconnection or, if it connects to a metal interconnection the metal interconnection does not provide any fixed voltage to p-type well layer 208a. Even though p-type well layer 208a is electrically floating, the voltage of p-type well layer 208a could be substantially equal to that of n-type deep well layer 206 in the long run, due to the very little PN junction leakage through the PN junction between p-type well layer 208a and n-type deep well layer 206. P-type well layer 208a in FIG. 4 could also reduce the surface electric field of n-type deep well layer 206, enhancing drain-to-source breakdown voltage of semiconductor device 200c.

Figure 5A:
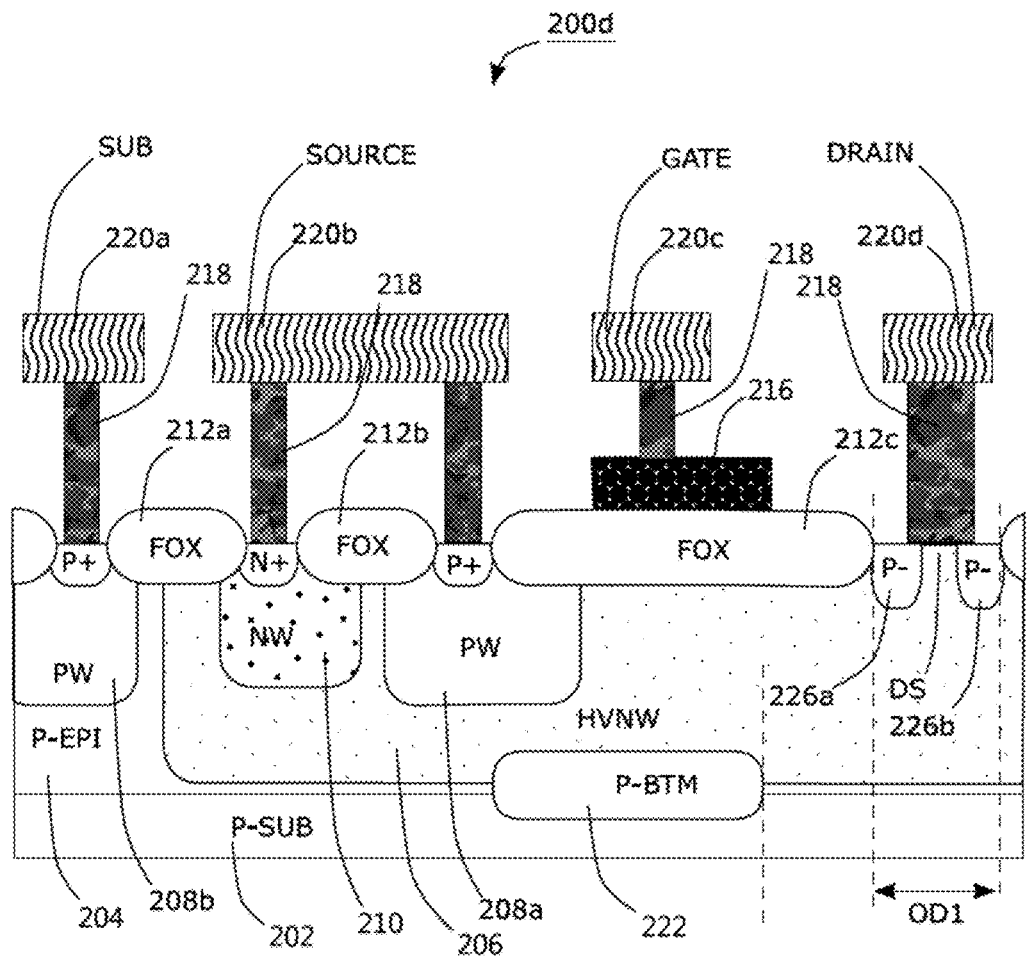
FIG. 5A demonstrates a cross-sectional view of another semiconductor device according to embodiments of the invention.
Figure 5B:
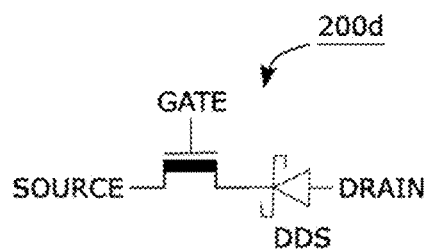
FIG. 5B demonstrates a symbol representing the semiconductor device in FIG. 5A.

FIG. 5A demonstrates a cross-sectional view of semiconductor device 200d according to embodiments of the invention. FIG. 5A has structures or connections similar or the same with those shown by semiconductor devices 100, 200a, 200b and 200c, and these structures or connections are not detailed herein because they are comprehensible in view of the teaching to FIGS. 1, 2A, 3 and 4. The drain electrode DRAIN of semiconductor device 200a in FIG. 2A electrically shorts to n-type deep well layer 206 via n-type heavily doped layer 213b. Semiconductor device 200d in FIG. 5A, unlike semiconductor device 200a in FIG. 2A, has the contact plug 218 of drain electrode DRAIN directly contact with a surface of n-type deep well layer 206 inside active region OD1, to form Schottky contact DS. In the cross-sectional view of FIG. 5A, Schottky contact DS is sandwiched by two p-type lightly-doped layers 226a and 226b, both electrically connecting to drain electrode DRAIN. In a top view of semiconductor device 200d, two p-type lightly-doped layers 226a and 226b might belong to a common p-type lightly-doped region that surrounds Schottky contact DS. These p-type lightly-doped layers 226a and 226b could form ohmic contact with contact plugs 218 to electrically connect drain electrode DRAIN. FIG. 5B demonstrates a symbol representing semiconductor device 200d, which consists of a depletion-mode metal-oxide-semiconductor (MOS) transistor and Schottky diode DDS connected in series, where Schottky contact DS embodies Schottky diode DDS. Schottky diode DDS prevents reverse current flowing from source electrode SOURCE to drain electrode DRAIN, and provides a less forward voltage that consumes less power when positive biased. P-type lightly-doped layers 226a and 226b can enhance the breakdown voltage of Schottky diode DDS.

Figure 6:
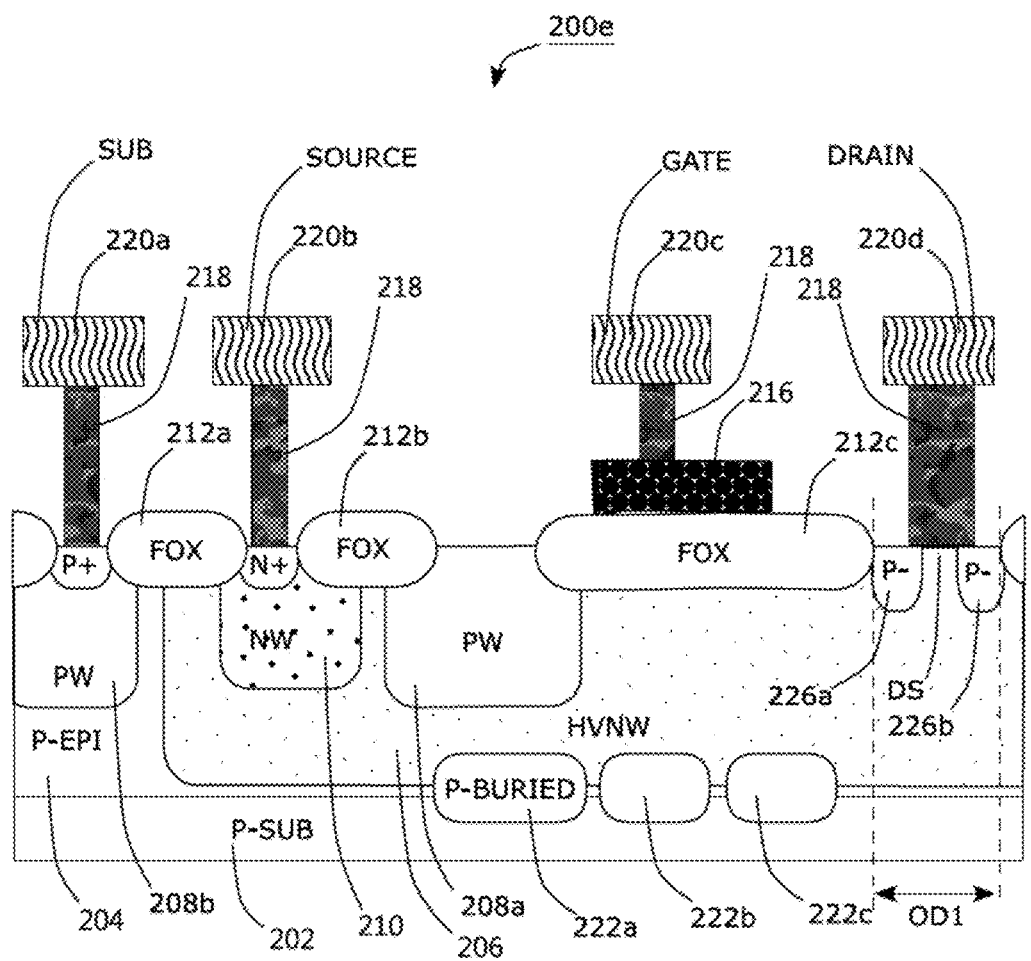
FIG. 6 demonstrates a cross-sectional view of another semiconductor device according to embodiments of the invention.

Features in the aforementioned embodiments could be combined in one embodiment of the invention. FIG. 6 demonstrates a cross-sectional view of semiconductor device 200e according to embodiments of the invention. Semiconductor device 200e has several p-type bottom layers 222a, 222b and 222c, electrically-floating p-type well layer 208a, and Schottky contact DS, and could be comprehensible in view of the teaching regarding to semiconductor devices 100, 200a, 200b, 200c and 200d.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device with gate, source and drain electrodes, comprising:
   a substrate of a first-type conductivity;
   a deep well layer of a second-type conductivity opposite to the first-type conductivity, the deep well layer formed on the substrate and having a surface;
   a field isolation layer formed on the surface and between a drain active region and a source active region, isolating the drain active region from the source active region;
   a source metal interconnection contacting the source active region on the surface to form an ohmic contact, the source metal interconnection used as the source electrode;
   a drain metal interconnection contacting the drain active region on the surface, used as the drain electrode;
   a first well layer of the first-type conductivity, formed on the surface and between the ohmic contact and the drain active region, wherein at least a portion of the first well layer is under the field isolation layer;
   a bottom layer of the first-type conductivity, formed at a bottom of the deep well layer; and
   a control gate on the field isolation layer, used as the gate electrode;
   wherein a gate voltage applied to the control gate controls a conductive channel in the deep well layer, and the conductive channel electrically connects the source and drain electrodes.

2. The semiconductor device as claimed in claim 1, wherein the bottom layer at least partially overlaps with the field isolation layer.

3. The semiconductor device as claimed in claim 2, wherein the bottom layer at least partially overlaps with the first well layer.

4. The semiconductor device as claimed in claim 1, wherein the bottom layer does not overlap with the drain active region.

5. The semiconductor device as claimed in claim 1, wherein the source metal interconnection contacts the first well layer.

6. The semiconductor device as claimed in claim 1, wherein the first well layer is electrically floating.

7. The semiconductor device as claimed in claim 1, wherein the semiconductor device comprises bottom layers, each at least partially overlapping with the field isolation layer and not overlapping with the drain active region.

8. The semiconductor device as claimed in claim 1, wherein the drain metal interconnection connects the deep well layer to form a Schottky contact.

9. The semiconductor device as claimed in claim 8, comprising:
   two first doped layers of the first-type conductivity, formed on the surface and sandwiching the Schottky contact.

10. The semiconductor device as claimed in claim 1, comprising:
    a doped layer of the second-type conductivity, formed inside the drain active region and on the surface, to provide another ohmic contact connecting the drain metal interconnection and the deep well layer.

11. A semiconductor device with gate, source and drain electrodes, comprising:
    a substrate of a first-type conductivity;
    a deep well layer of a second-type conductivity opposite to the first-type conductivity, the deep well layer formed on the substrate and having a surface, and providing a channel electrically connecting the source and drain electrodes;
    a field isolation layer formed on the surface;
    a first well layer of the first-type conductivity, formed on the surface and at least partially overlapping with the field isolation layer;
    a bottom layer of the first-type conductivity, formed at a bottom of the deep well layer and at least partially overlapping with the field isolation layer, wherein the channel goes through a gap between the bottom layer and the first well layer; and
    a control gate as the gate electrode, formed above the field isolation layer, to control the channel;
    wherein the control gate is not electrically connected to the first well layer.

12. The semiconductor device as claimed in claim 11, wherein the first well layer is electrically floating.

13. The semiconductor device as claimed in claim 11, wherein the first well layer electrically connects to the source electrode.

14. The semiconductor device as claimed in claim 11, wherein the field isolation layer separates a drain active region from a source active region on the surface of the deep well layer, and the bottom layer does not overlap with the drain active region.

15. The semiconductor device as claimed in claim 14, wherein the semiconductor device comprises a plurality of bottom layers, each at least partially overlapping with the field isolation layer and not overlapping with the drain active region.

16. The semiconductor device as claimed in claim 11, wherein the field isolation layer separates a drain active region from a source active region on the surface of the deep well layer, the semiconductor device further comprises a Schottky contact formed in the drain active region and electrically connected to the drain electrode.

17. The semiconductor device as claimed in claim 16, wherein the Schottky contact is sandwiched by doped layers of the second-type conductivity.

18. The semiconductor device as claimed in claim 11, comprising:
    a second well layer of the second-type conductivity, formed on the surface and electrically connected to the source electrode.

19. The semiconductor device as claimed in claim 11, wherein the semiconductor device further has a substrate electrode, the semiconductor device comprising:
    an epitaxy layer of the first-type conductivity, formed above the substrate; and
    a second well layer of the first-type conductivity, formed on the epitaxy layer and electrically connecting the substrate electrode to the epitaxy layer and the substrate.

20. The semiconductor device as claimed in claim 11, wherein the bottom layer at least partially overlaps with the first well layer.

* * * * *